(12) United States Patent
Park et al.

(10) Patent No.: US 7,491,619 B2
(45) Date of Patent: Feb. 17, 2009

(54) METHODS OF FABRICATING SEMICONDUCTOR DEVICES

(75) Inventors: Kang-Wook Park, Seoul (KR); Hyung-Moo Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 273 days.

(21) Appl. No.: 11/594,177

(22) Filed: Nov. 8, 2006

(65) Prior Publication Data

US 2007/0105257 A1 May 10, 2007

(30) Foreign Application Priority Data

Nov. 8, 2005 (KR) .................. 10-2005-0106683

(51) Int. Cl.
*H01L 21/20* (2006.01)

(52) U.S. Cl. .................. 438/396; 438/387; 438/397; 438/399; 438/622; 438/739

(58) Field of Classification Search ............... 438/387, 438/396–397, 399, 622, 739
See application file for complete search history.

(56) References Cited

U.S. PATENT DOCUMENTS

| | | | | |
|---|---|---|---|---|
| 5,604,138 A | * | 2/1997 | Lee et al. | 438/307 |
| 6,482,726 B1 | * | 11/2002 | Aminpur et al. | 438/585 |
| 6,838,717 B1 | * | 1/2005 | Yen et al. | 257/295 |
| 6,919,244 B1 | * | 7/2005 | Remmel et al. | 438/239 |
| 7,078,310 B1 | * | 7/2006 | Kar-Roy et al. | 438/396 |
| 2004/0152258 A1 | * | 8/2004 | Kiyotoshi | 438/253 |
| 2005/0118778 A1 | * | 6/2005 | Gau | 438/396 |
| 2005/0255664 A1 | * | 11/2005 | Kao et al. | 438/396 |
| 2005/0263848 A1 | * | 12/2005 | Cho | 257/532 |
| 2006/0197183 A1 | * | 9/2006 | Yang et al. | 257/532 |

FOREIGN PATENT DOCUMENTS

| | | |
|---|---|---|
| JP | 07-0223396 | 1/1995 |
| KR | 10-2005-0010149 | 1/2005 |
| KR | 10-2005-0055433 | 6/2005 |

* cited by examiner

*Primary Examiner*—Zandra Smith
*Assistant Examiner*—Bac H Au
(74) *Attorney, Agent, or Firm*—Harness, Dickey & Pierce, P.L.C.

(57) ABSTRACT

Disclosed are methods of fabricating semiconductor devices. A method may include forming a first conductive layer, a first dielectric layer, a second conductive layer, a second dielectric layer, and a third conductive layer. The method may also include forming a mask layer on the third conductive layer, forming a photoresist pattern on the mask layer, and forming at least one middle electrode by patterning the mask layer, the third conductive layer, the second dielectric layer, and the second conductive layer using the photoresist pattern as an etching mask. The method may also include forming a mask pattern by selectively etching a side wall of the patterned mask layer, removing the photoresist pattern, and forming an upper electrode by patterning the third conductive layer using the mask pattern as an etching mask.

20 Claims, 6 Drawing Sheets

US 7,491,619 B2

METHODS OF FABRICATING SEMICONDUCTOR DEVICES

PRIORITY STATEMENT

This application claims priority under 35 U.S.C. §119 to Korean Patent Application No. 10-2005-0106683 filed on Nov. 8, 2005, in the Korean Intellectual Property Office (KIPO), the entire disclosure of which is incorporated herein by reference.

BACKGROUND

Example embodiments relate to methods of fabricating semiconductor devices, for example, to methods of fabricating semiconductor devices which may include a MIM (Metal-Insulator-Metal) capacitor.

DESCRIPTION OF THE RELATED ART

In general, some capacitors may be classified as MOS (Metal-Oxide-Silicon) capacitors, pn-junction capacitors, PIP (polysilicon-insulator-polysilicon) capacitors, or MIM capacitors. The classification depends on the structure of the capacitor junction. Among these capacitors, capacitors other than the MIM capacitor may include monocrystalline silicon or polycrystalline silicon as material for at least one electrode. However, the monocrystalline or polycrystalline silicon may have a reduced ability to decrease the resistance of the capacitor electrode due to the material properties of the monocrystalline or polycrystalline silicon. In addition, when a bias voltage is applied to an electrode formed of monocrystalline or polycrystalline silicon, a depletion region may be formed and the voltage may become unstable, resulting in a non-uniform capacitance.

The MIM capacitor is advantageous because it may decrease the resistance of a capacitor electrode so as to realize low frequency dependence and may have low variation in capacitance depending on voltage and/or temperature. Therefore, MIM capacitors has been employed in various analog products, nixed-mode signal applications, and system-on-chip (SoC) applications. For example, MIM capacitors have been applied as analog capacitors and filters, RF capacitors of high-frequency circuits, capacitors of image sensors, and in LDI (Liquid Crystal Display Driver Integrated Circuit) for use in analog or mixed-mode signal applications of wired and wireless communication.

Recently, attempts have been made to further increase the capacitance of MIM capacitors so as to satisfy the trend toward an increased degree of integration of semiconductor devices. However, conventional methods of fabricating a layered MIM capacitor require additional use of a mask for patterning each electrode. This additional use of masks undesirably complicates the fabrication process and may negate economic benefits.

SUMMARY OF THE INVENTION

Accordingly, example embodiments have been made keeping in mind the above problems occurring in the related art, and an object of example embodiments is to provide methods of fabricating semiconductor devices which may increase the capacitance per unit area or MIM capacitors, and provide simplified fabrication processes.

Example embodiments may provide methods of fabricating semiconductor devices. In an example embodiment, a method may include sequentially forming a first conductive layer, a first dielectric layer, a second conductive layer for a middle electrode, a second dielectric layer, and a third conductive layer for an upper electrode on an interlayer insulating layer. The method may further include forming a mask layer on the conductive layer for the third electrode, forming a photoresist pattern defining the second electrode on the mask layer and forming the second electrode by the sequentially patterning the mask layer, the conductive layer for the third electrode, the second dielectric layer, and the conductive layer using the photoresist pattern as an etching mask. The method may further include forming a mask pattern defining the third electrode by the selectively etching a side wall of the patterned mask layer, removing the photoresist pattern, and forming the third electrode by patterning the conductive layer for the third electrode using the mask pattern defining the third electrode as an etching mask.

In an example embodiment, the method may further include forming a lower electrode by patterning the first dielectric layer and the first conductive layer, wherein the first conductive layer is formed on an interlayer insulating layer.

In an example embodiment, the first conductive layer is a lower electrode.

In an example embodiment, the lower electrode is formed by a damascene process.

In an example embodiment, the method may further include forming a metal capping layer between the lower electrode and the first dielectric layer, and patterning the metal capping layer.

In an example embodiment, the mask layer is one of silicon oxide and silicon nitride.

In an example embodiment, the mask layer is formed of a material having an etching selectivity different from the first dielectric layer and the second dielectric layer.

In an example embodiment, the mask pattern is formed by an isotropic etching process.

In an example embodiment, the method may further include forming a metal capping layer between the first conductive layer and the first dielectric layer.

In an example embodiment, the method may further include forming an insulating layer covering the semiconductor device.

In an example embodiment, the method may further include forming via holes in the insulating layer, which are connected to the first conductive layer, the middle electrode, and the upper electrode.

In an example embodiment, the method may further include forming a metal wire layer of the same material as that of the first conductive layer at a same layer as that of the first conductive layer.

In an example embodiment, the method may further include forming an etching stop layer over the upper electrode, middle electrode, and second dielectric layer.

In an example embodiment, the first dielectric layer is a material with a high dielectric constant.

In an example embodiment, the first dielectric layer is one of $SiO_2$, $Si_xN_y$, $SiON$, $Si_xC_y$, $Si_xO_yN_z$, $Si_xO_yC_z$, $Al_xO_y$, $Hf_xO_y$, and $Ta_xO_y$.

In an example embodiment, the first dielectric layer is comprised of multiple layers of dielectric material.

In an example embodiment, the second dielectric layer is a material with a high dielectric constant.

In an example embodiment, the second dielectric layer is one of $SiO_2$, $Si_xN_y$, $SiON$, $Si_xC_y$, $Si_xO_yN_z$, $Si_xO_yC_z$, $Al_xO_y$, $Hf_xO_y$, and $Ta_xO_y$.

In an example embodiment, the second dielectric layer is comprised of multiple layers of dielectric material.

In an example embodiment, the first conductive layer, the second conductive layer, and the third conductive layer are one of Ti, TiN, TiW, Ta, TaN, W, WN, Pt, Ir, Ru, Rh, Os, Pd, and Al.

In an example embodiment, a method may include forming a first electrode and sequentially forming a first dielectric layer, a conductive layer for a second electrode, a second dielectric layer, and a conductive layer for a third electrode on the first electrode. The method may also include forming a mask layer on the conductive layer for the third electrode, forming a photoresist pattern defining the second electrode on the mask layer and forming the second electrode by the sequentially patterning the mask layer, the conductive layer for the third electrode, the second dielectric layer, and the conductive layer for the second electrode using the photoresist pattern as an etching mask. The method may further include forming a mask pattern defining the third electrode by the selectively etching a side wall of the patterned mask layer and forming the third electrode by the patterning the conductive layer for the third electrode using the mask pattern defining the third electrode as an etching mask.

Example embodiments may lead to completion of an MIM capacitor.

BRIEF DESCRIPTION OF THE DRAWINGS

The above and other objects, features, and advantages of example embodiments will be more clearly understood from the following detailed description taken in conjunction with the accompanying drawings, in which.

DESCRIPTION OF EXAMPLE EMBODIMENTS

Figure 1A:
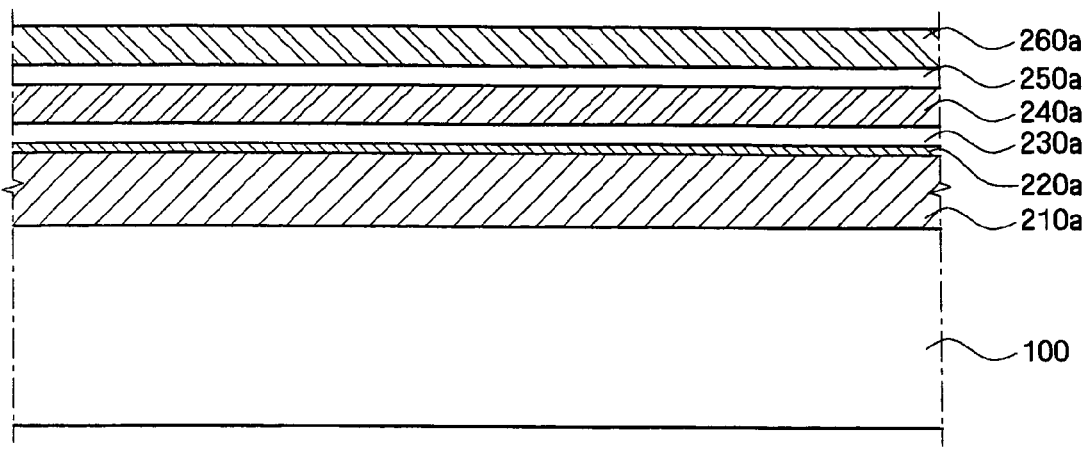
FIGS. 1A to 1I are cross-sectional views showing a process of fabricating a semiconductor device, according to an example embodiment.

Reference now should be made to the drawings, in which the same reference numerals are used throughout the different drawings to designate the same or substantially similar components. Further, example embodiments are described, with reference to cross-sectional views provided as ideal illustrations thereof As such, the type of illustration may vary depending on fabrication techniques and/or allowable error. Thus, the example embodiments are not limited to the specific shapes shown in the drawings but include changes in shape depending on the fabrication process. For example, the etched region represented by a rectangular shape may be in the form of a round shape, or may have a predetermined curvature. Accordingly, regions shown in the drawings are schematically depicted, the shapes of which are set forth to illustrate the shapes of the regions of the device of example embodiments, but should not be construed to limit the scope of the present invention.

Detailed illustrative embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of example embodiments. Similarly, although the terms upper, middle, lower, etc. may be used herein to describe components, layers, and/or sections, it should be understood that these components, layers, and/or sections should not be limited to these terms. These terms are used only to distinguish one component, layer, and/or section from another, and as such, these terms do not imply any specific orientation or order. Thus an upper element could be termed a lower element, without departing from the teachings of example embodiments.

The terminology used herein is for the purpose of describing example embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof In addition, in the case where a first layer is said to be formed on a second layer or semiconductor substrate or to be in contact therewith, it is to be understood that the first layer may be in direct contact with the second layer or with the semiconductor substrate, or that a third layer may be interposed therebetween.

FIGS. 1A to 1I illustrate a process of fabricating a semiconductor device, according to an example embodiment. Hereafter, conventional processes, which may be implemented using process steps known to those skilled in the art, may be briefly explained in order to avoid ambiguity with regards to example embodiments.

As shown in FIG. 1A, a first conductive layer 210a, a first dielectric layer 230a, a second conductive layer 240a, a second dielectric layer 250a, and a third conductive layer 260a may be provided on an interlayer insulating layer 100, which may be formed on a substrate (e.g., a semiconductor substrate).

Individual conductive layers may be formed into a single layer or a layered layer using Ti, TiN, TiW, Ta, TaN, W, WN, Pt, Ir, Ru, Rh, Os, Pd, or Al, but example embodiments are not limited thereto. The first conductive layer (for the first electrode) may be formed to a thickness of about 1000 Å or more when forming various conductive layers for wires. The respective conductive layers for the second electrode and for the third electrode may be about 500~3000 Å thick.

In addition, individual dielectric layers may be formed into a single layer or a layered layer using $SiO_2$, $Si_xN_y$, SiON, $Si_xC_y$, $Si_xO_yN_z$, $Si_xO_yC_z$, $Al_xO_y$, $Hf_xO_y$, $Ta_xO_y$, or any material having a high dielectric constant (e.g., high k or κ), but example embodiments are not limited thereto. For example, each dielectric layer may be formed of different materials, or may be formed of multiple layers of the same or different materials to alter the dielectric constant as deemed fit. Such dielectric layers may be about 200~1000 Å thick.

A metal capping layer 220a may be interposed between the first conductive layer 210a and the first dielectric layer 230a.

The conductive layers and dielectric layers may be formed using any known thin layer formation process, such as CVD, PVD, or ALD. As such, the flow rate, temperature, and pressure of source gas used for the formation process may vary depending on the type of deposition apparatus. Any flow rate, temperature and pressure suitable for the formation of the conductive layers and dielectric layers may be applied within the spirit and scope of example embodiments.

Figure 1B:
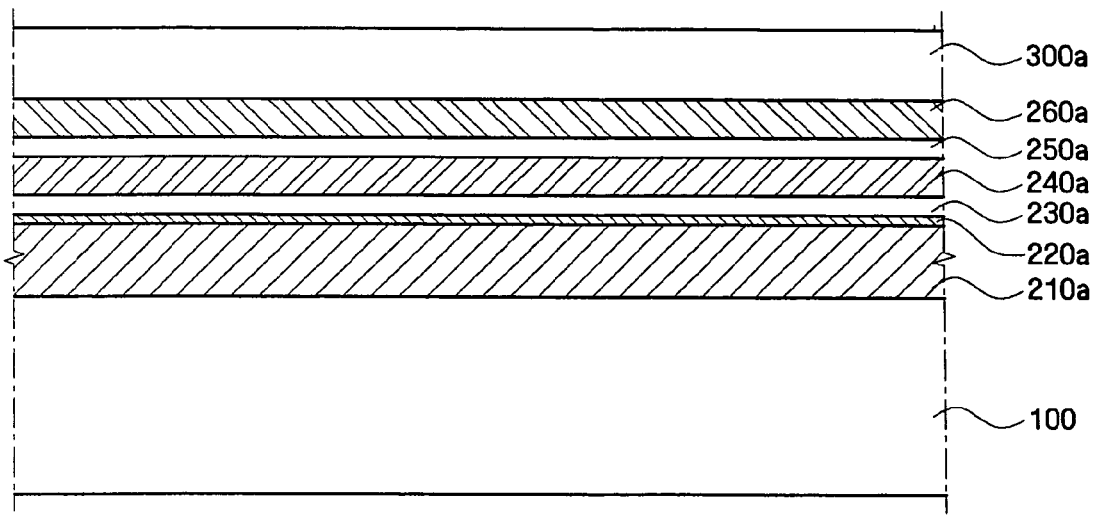

As shown in FIG. 1B, a mask layer 300a may be formed on the third conductive layer 260a Examples of material for the mask layer 300a include, but are not limited to, silicon oxide and silicon nitride. However, in at least one example embodiment in consideration of any subsequent etching process, the mask layer 300a may be formed of a material having etching selectivity different from those of the other layers (e.g., the first dielectric layer 230a and the second dielectric layer 250a) able to be formed using a material similar to that of the mask layer 300a.

Because the mask layer 300a may be used as an etching mask upon the formation of the third electrode, it should have a thickness sufficient to serve as the etching mask in an etching process for the formation of the third electrode. For example, the thickness of the mask layer 300a may be about 1.5 times that of the third conductive layer 260a, and may be set within a range that does not inhibit the purpose of example embodiments.

The mask layer 300a may be formed using any process well known in the art, for example, the mask layer 300a may be deposited through CVD at about 500° C. or less.

Figure 1C:
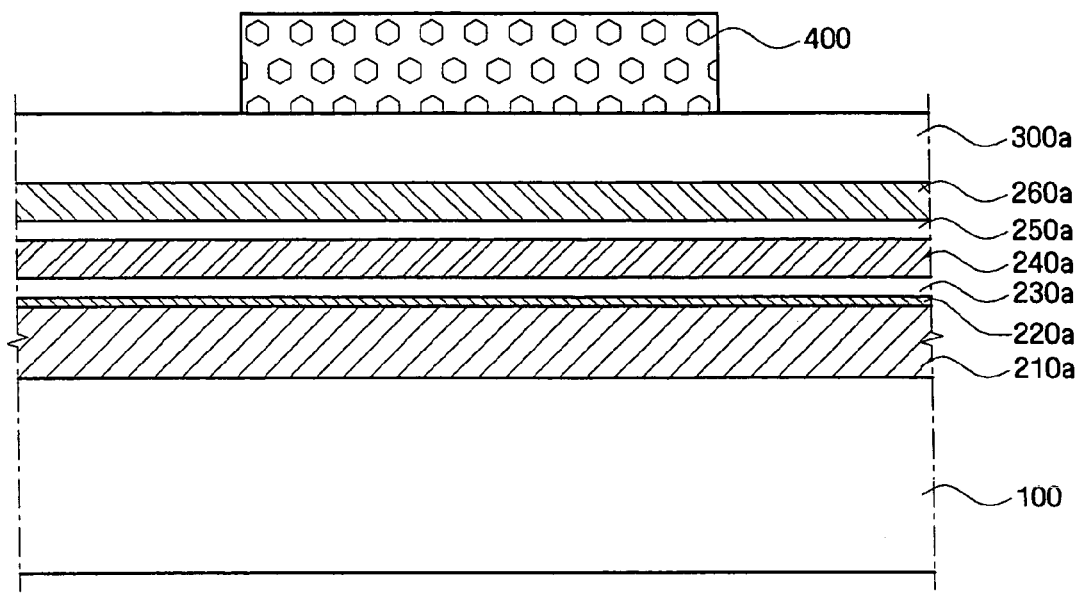

As shown in FIG. 1C, a photoresist pattern 400 defining the second electrode may be formed on the mask layer 300a. The process of forming photoresist pattern 400 may be photolithography, or any other process which is well known in the art, and thus the thickness, material, and formation process of the photoresist pattern 400 may be set within a range that does not inhibit the purpose of example embodiments.

Figure 1D:
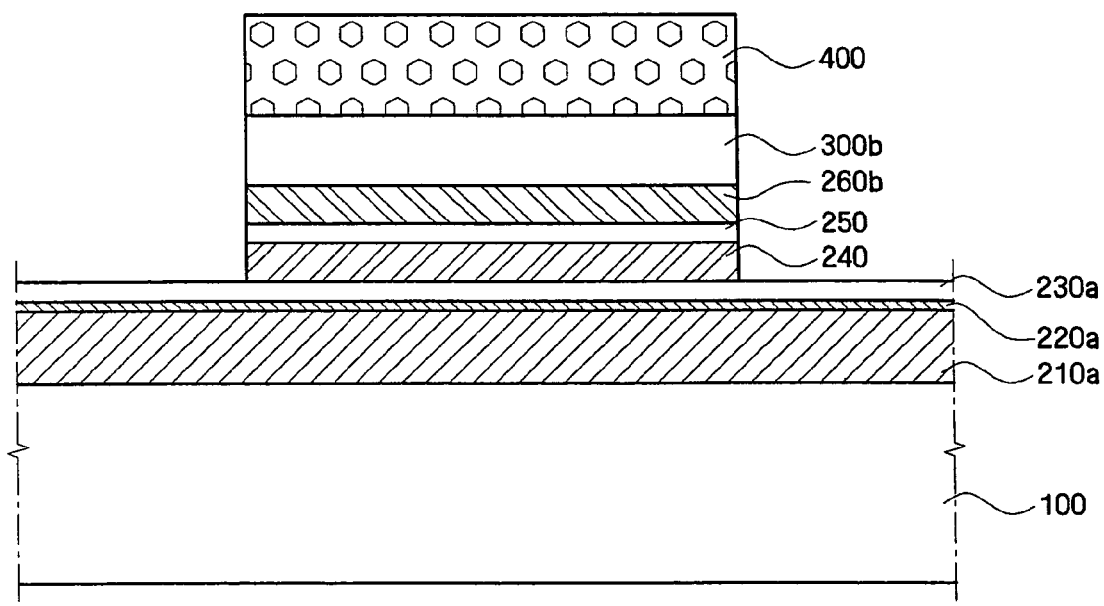

As shown in FIG. 1D, the mask layer 300a (FIG. 1C), the third conductive layer 260a (FIG. 1C), the second dielectric layer 250a (FIG. 1C), and the second conductive layer 240a (FIG. 1C) may be patterned using the photoresist pattern 400 as an etching mask. Thereby, the second electrode 240 having the second dielectric layer 250 thereon may be formed.

In addition, through the patterning process, the mask layer 300b and the third conductive layer 260b may be patterned to have a profile corresponding to the photoresist pattern 400. Accordingly, the side wall of the patterned mask layer 300b may be exposed.

In such an example, although the first dielectric layer 230a may be partially etched, it should mostly remain in order for some protection of the upper surface of the first conductive layer 210a in subsequent processes.

The etching process may be performed using an isotropic etching process, such as dry etching, which is well known in the art, and the conditions thereof are set within a range that does not inhibit the purpose of example embodiments.

Figure 1E:
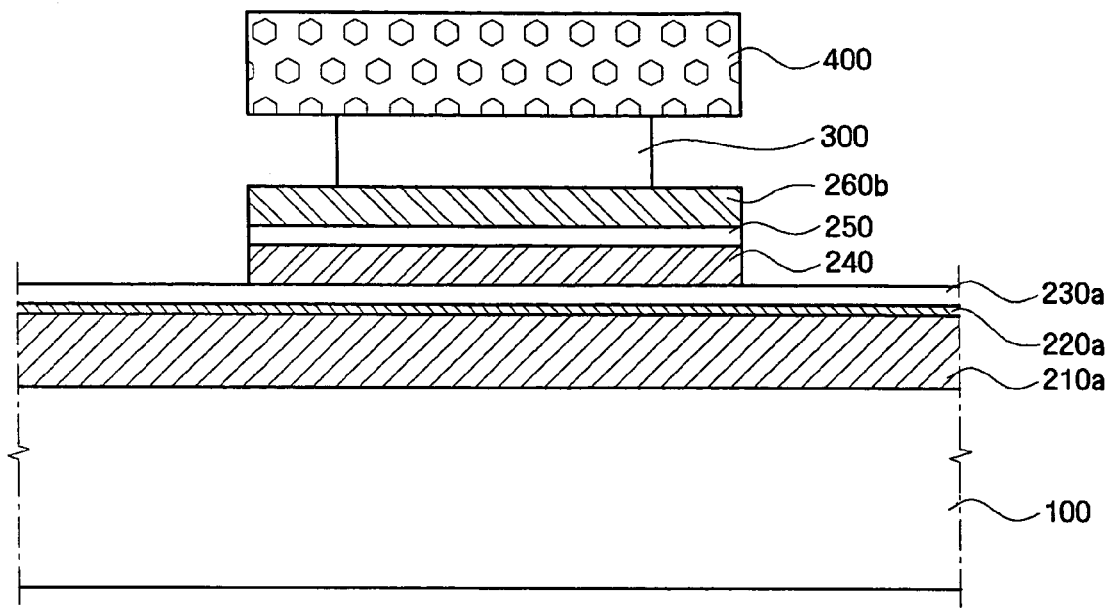

As shown in FIG. 1E, the exposed side wall of the patterned mask layer 300b (FIG. 1D) may be selectively etched, thus forming a mask pattern 300 defining the third electrode.

For example, the side wall of the patterned mask layer 300b (FIG. 1D) may be etched inwards such that the width of the mask layer is substantially equal to that of the third electrode to be subsequently formed. As such, selective etching of the exposed side wall of the patterned mask layer 300b (FIG. 1D) may be conducted through an isotropic etching process. Particularly, a wet etching process or a plasma dry etching process may be applied, but example embodiments are not limited thereto.

In a wet etching process, a wet etchant, such as diluted HF or DHF, or a buffered oxide etchant (BOE), such as buffered HF, may be used, but example embodiments are not limited HF, thereto. In addition, a plasma dry etching process may require the use of a plasma etching apparatus such as a CDE (Chemical Dry Etching) system, but example embodiments are not limited thereto.

Moreover, since the exposed conductive and dielectric layers may not be affected by the etching process, such a selective etching process may be carried out which may have a relatively high etching selectivity only for the patterned mask layer 300b (FIG. 1D). For example, the patterned mask layer 300b (FIG. 1D) may be formed of an insulating material similar to that of the dielectric layer. As such, it may be important to appropriately control the etching selectivity with each dielectric layer. Thereby, the mask pattern 300 usable for formation of the third electrode may be formed.

Because the upper surface of the patterned mask layer 300a (FIG. 1C) is masked with the photoresist pattern 400, the side wall of the patterned mask layer 300b (FIG. 1D) may alone be selectively etched, and the upper surface of the patterned mask layer 300b (FIG. 1D) may remain substantially unetched.

In this way, according an example embodiment, the mask layer 300 for the formation of the third electrode may be formed without the need for an additional photoresist pattern, and therefore, a conventional photolithographic process may be omitted.

Figure 1F:
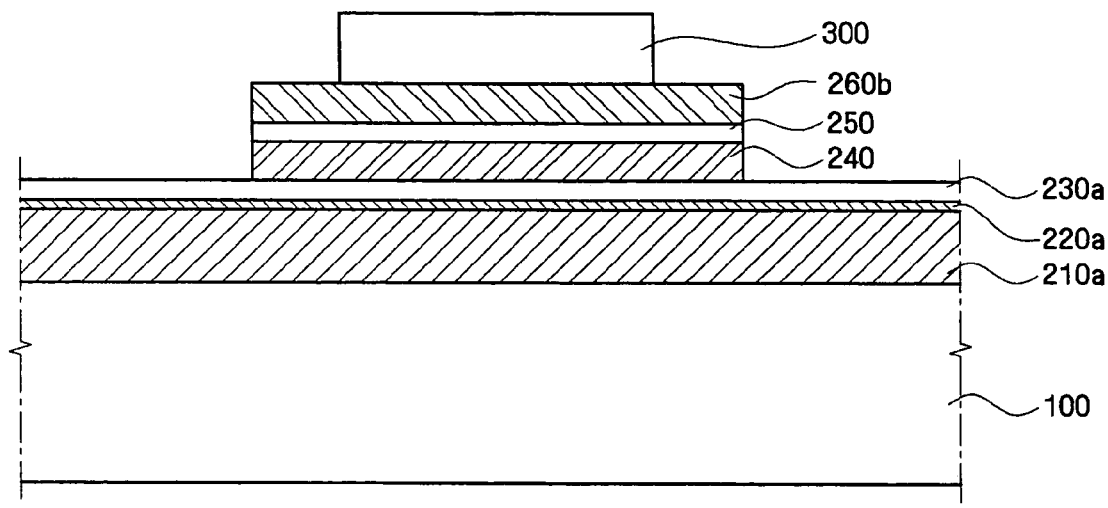

As shown in FIG. 1F, the photoresist pattern 400 may be removed. When the photoresist pattern 400 is removed, the upper surface of the mask layer 300 defining the third electrode on the patterned conductive layer 260b may be exposed.

In order to remove the photoresist pattern 400, any process well known in the art, for example, a dry process using plasma generated using RF or microwaves or a wet process using a chemical solution, may be used.

Figure 1G:
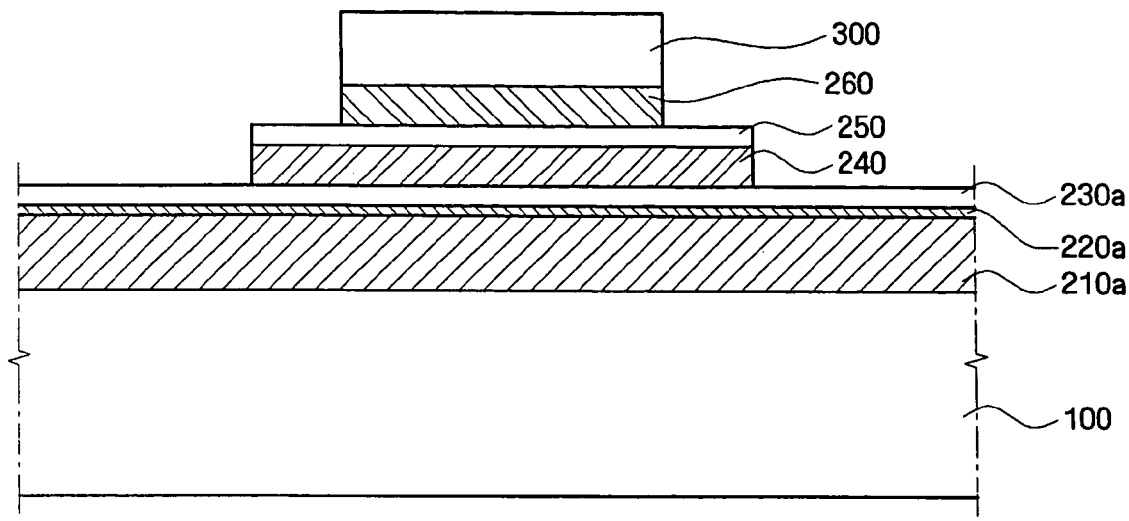

As shown in FIG. 1G, the third electrode 260 maybe formed.

To this end, the third conductive layer 260b (FIG. 1F) may alone be selectively etched using the mask pattern 300 (FIG. 1F) as the etching mask. Such an etching process may be based on an isotropic etching process such as a dry etching process. The mask pattern 300 defining the third electrode may be narrower than the photoresist pattern 400 used for the formation of the second electrode. Therefore, the third electrode 260 formed would be narrower than the second electrode 240.

In this example, although the second dielectric layer 250 may be etched therewith, it should preferably remain unetched so as not to expose the upper surface of the second electrode 240 in the interest of protecting the upper surface of the second electrode 240.

According to an example embodiment, the additional photoresist pattern for the formation of the third electrode is not needed, and the mask pattern for the formation of the third electrode may be formed using the photoresist pattern for the formation of the second electrode. Thus, in the process of fabricating a semiconductor device of example embodiments, a photolithographic process may be omitted. In this way, the fabrication process may be simplified, which may result in decreased fabrication cost and shortened fabrication periods.

As shown in the drawings, the mask pattern 300 defining the third electrode may remain even after formation of the third electrode 260. Alternatively, it may be selectively removed through any process known in the art, if necessary.

Figure 1H:
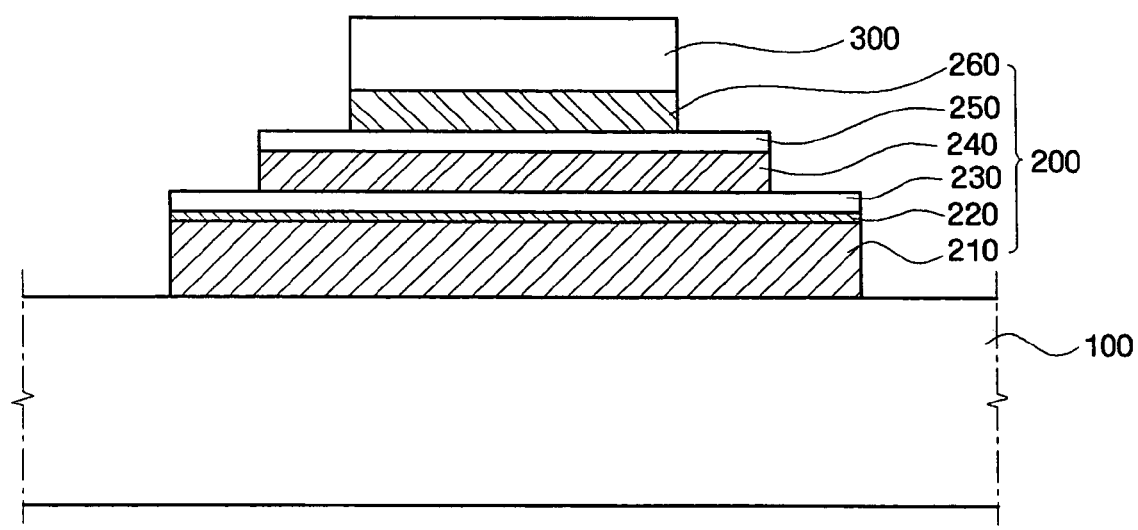

As shown in FIG. 1H, the first dielectric layer 230*a* (FIG. 1G) and the first conductive layer 210*a* (FIG. 1G) are patterned, thus forming the first electrode 210. Thereby, the MIM capacitor 200 is completed.

Although not shown in the additional drawing, an additional photoresist pattern for the formation of the first electrode may be further formed, or may be removed after the patterning process.

The first electrode 210 may be formed to be wider than the second electrode 240. Also, in the case where a metal capping layer 220*a* (FIG. 1G) is interposed between the first conductive layer 210*a* (FIG. 1G) and the first dielectric layer 230*a* (FIG. 1G), it may be patterned together when patterning the first dielectric layer 230*a* (FIG. 1G) and the first conductive layer 210*a* (FIG. 1G).

When forming the first electrode 210, a metal wire layer may be formed of the same conductive layer as that of the first electrode 210. Thus, a metal wire layer may be at the same layer as the first electrode 210.

A MIM capacitor 200 may have a structure comprising two capacitors layered together, and thus may have increased capacitance per unit area Furthermore, because parasitic capacitance with the substrate may be decreased, signal loss may also be decreased, thereby improving the RF properties of the semiconductor device. In an example embodiment, although a structure in which three electrodes and two dielectric layers are layered, that is, the structure in which two capacitors are layered, is disclosed, example embodiments are not limited thereto. In addition, capacitors having more electrodes and dielectric layers may be applied, if necessary. For example, additional capacitors may be stacked on those disclosed through the addition of an additional dielectric layer and electrode.

Figure 1I:
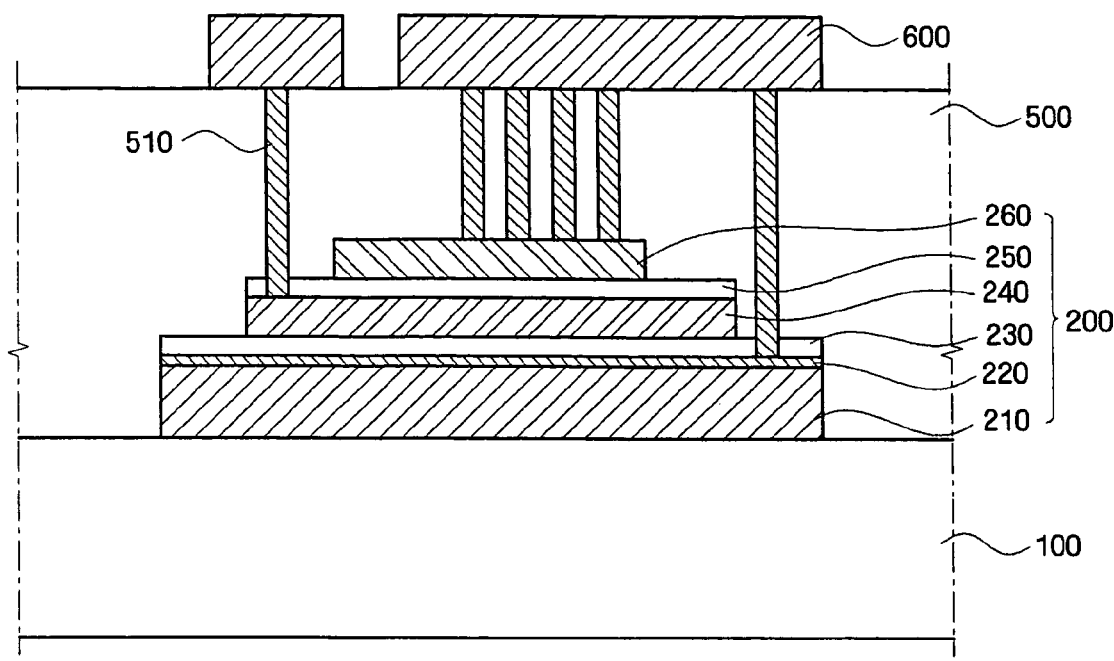

As shown in FIG. 1I, another interlayer insulating layer 500 covering the upper portion of the MIM capacitor 200 may be formed, and then via holes 510, functioning to connect respective electrodes 210, 240, 260 to wires, may be formed in the interlayer insulating layer 500. Such via holes 510 may be connected to wires 600. Although the wires 600 are depicted on the interlayer insulating layer 500 in FIG. 1I, example embodiments are not limited thereto. For example, other via holes (not shown) may be further formed on the via holes 510 and thus connected to wires formed on a different insulating layer (not shown). Moreover, although not shown in FIG. 1I, the via holes 510 and the wires 600 may be formed through a damascene wiring process.

As well, although not shown in the drawing, an etching stop layer may be formed to cover the upper portion and side surface of the capacitor 200 before formation of the interlayer insulating layer 500.

In FIG. 1I, although the mask pattern 300 (FIG. 1H) is not depicted, the mask pattern 300 may be included in the interlayer insulating layer 500, if not previously etched away, without departing from the spirit and scope of example embodiments.

A series of steps for forming other wires, forming a passivation layer on the substrate, and packaging the substrate may be further conducted using process steps well known to those skilled in the technical field of semiconductor devices, thus completing the semiconductor device. Such subsequent steps are briefly explained to avoid ambiguity with regards to example embodiments.

Figure 2A:
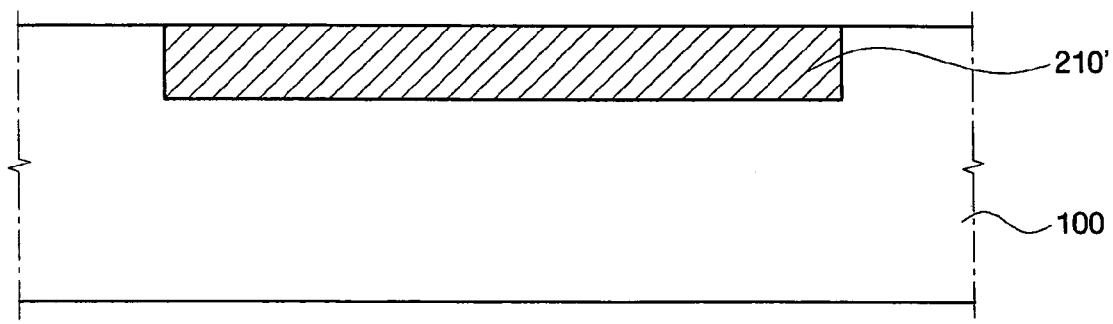
FIGS. 2A to 2C are cross-sectional views showing a process of fabricating a semiconductor device, according to an example embodiment.
Figure 2B:
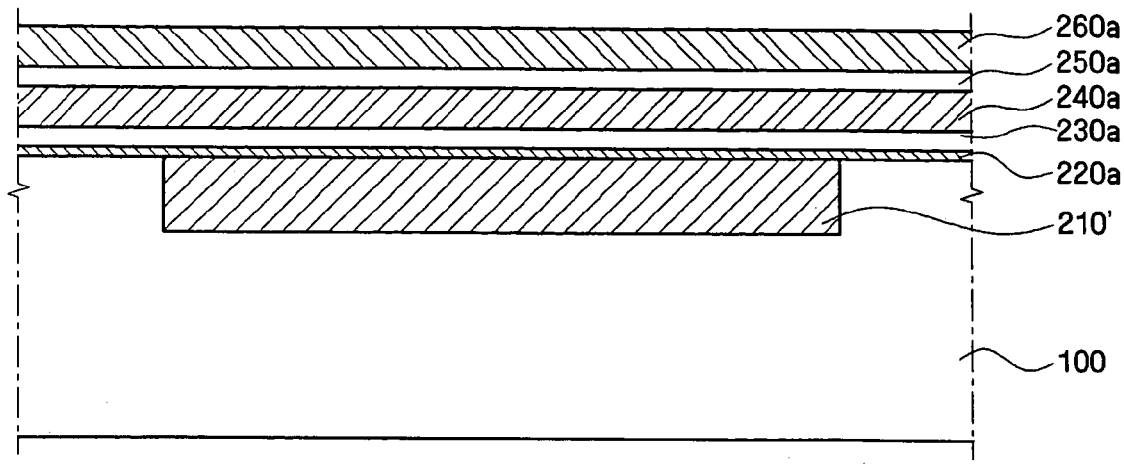
Figure 2C:
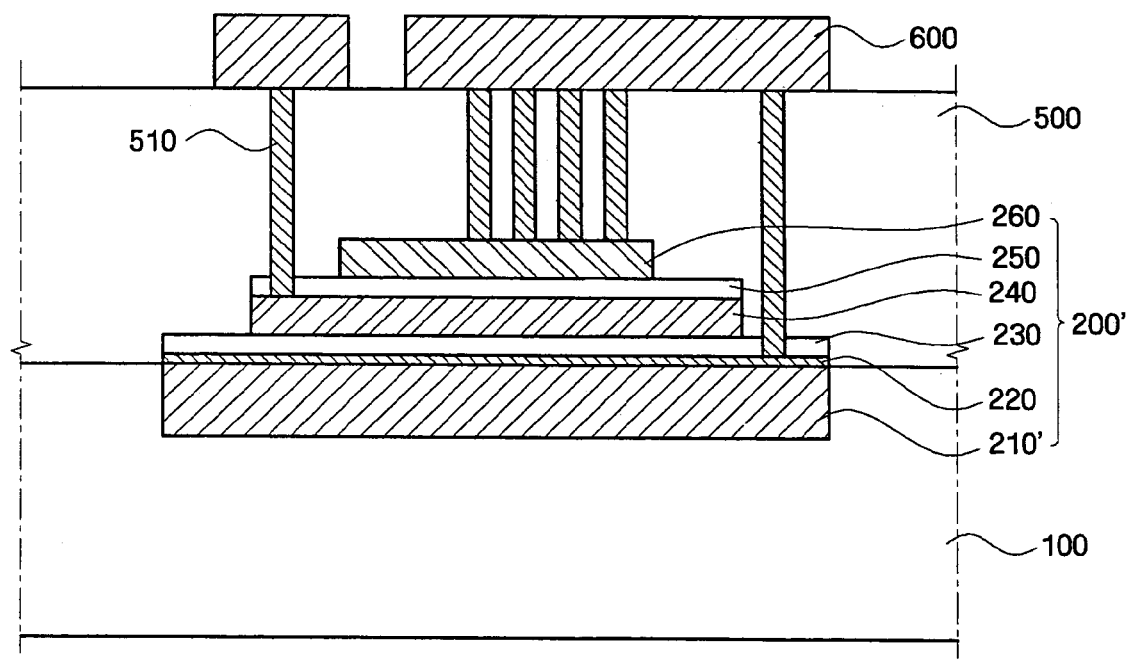

FIGS. 2A to 2C depict a process of fabricating a semiconductor device, according to an example embodiment. Below, processes, which may be implemented using process steps well known to those skilled in the art, are briefly explained to avoid ambiguity with regards to example embodiments. In addition, the portions of the fabrication process according to example embodiments that are redundant with previously described example embodiments are only briefly described or omitted, for the sake of brevity.

As shown in FIG. 2A, a first electrode 210' may be formed in an interlayer insulating layer 100. Such a first electrode 210' may be formed through a damascene wiring process.

As shown in FIG. 2B, a first dielectric layer 230*a*, a second conductive layer 240*a*, a second dielectric layer 250*a*, and a third conductive layer 260*a* may be sequentially formed on the first electrode 210'. In addition, a metal capping layer 220*a* may be interposed between the first electrode 210' and the first dielectric layer 230*a*.

Then, subsequent processes for the formation of an MIM capacitor are substantially similar as the semiconductor device fabrication process according to the example embodiments mentioned above, and thus the description thereof is omitted for the sake of brevity.

As shown in FIG. 2C, another interlayer insulating layer 500 covering the MIM capacitor 200' may be formed, followed by forming via holes that are connected to respective electrodes. The upper portions of such via holes may be connected to wires, which may be as mentioned above.

As described hereinbefore, example embodiments may provide methods of fabricating semiconductor devices. According to example embodiments, a semiconductor device having an MIM capacitor may be provided, the fabrication cost of which may be decreased, thanks to the simplified fabrication process, and the capacitance properties of which may be improved.

Although example embodiments have been disclosed for illustrative purposes, those skilled in the art will appreciate that various modifications, additions and substitutions are possible, without departing from the scope and spirit of example embodiments as disclosed in the accompanying claims.

What is claimed is:

1. A method of fabricating a semiconductor device, comprising:
   sequentially forming a first conductive layer, a first dielectric layer, a second conductive layer, a second dielectric layer, and a third conductive layer;
   forming a mask layer on the third conductive layer;
   forming a photoresist pattern on the mask layer;

forming at least one middle electrode by etching away a portion of the mask layer, the third conductive layer, the second dielectric layer, and the second conductive layer using the photoresist pattern as an etching mask;

forming a mask pattern by selectively etching a side wall of the mask layer;

removing the photoresist pattern; and forming an upper electrode by patterning the third conductive layer using the mask pattern.

2. The method of claim 1, further comprising forming a lower electrode by patterning the first dielectric layer and the first conductive layer, wherein the first conductive layer is formed on an interlayer insulating layer.

3. The method of claim 1, wherein the first conductive layer is a lower electrode.

4. The method of claim 3, wherein the lower electrode is formed by a damascene process.

5. The method of claim 3, further comprising forming a metal capping layer between the lower electrode and the first dielectric layer, and patterning the metal capping layer.

6. The method of claim 1, wherein the mask layer is one of silicon oxide and silicon nitride.

7. The method of claim 1, wherein the mask layer is formed of a material having an etching selectivity different from the first dielectric layer and the second dielectric layer.

8. The method of claim 1, wherein the mask pattern is formed by an isotropic etching process.

9. The method of claim 1, further comprising forming a metal capping layer between the first conductive layer and the first dielectric layer.

10. The method of claim 1, further comprising forming an insulating layer covering the semiconductor device.

11. The method of claim 10 further comprising forming via holes in the insulating layer, which are connected to the first conductive layer, the middle electrode, and the upper electrode.

12. The method of claim 1, further comprising forming a metal wire layer of the same material as that of the first conductive layer at a same layer as that of the first conductive layer.

13. The method of claim 1, further comprising forming an etching stop layer over the upper electrode, middle electrode, and second dielectric layer.

14. The method of claim 1, wherein the first dielectric layer is a material with a high dielectric constant.

15. The method of claim 1, wherein the first dielectric layer is one of $SiO_2$, $Si_xN_y$, SiON, $Si_xC_y$, $Si_xO_yN_z$, $Si_xO_yC_z$, $Al_xO_y$, $Hf_xO_y$, and $Ta_xO_y$.

16. The method of claim 1, wherein the first dielectric layer is comprised of multiple layers of dielectric material.

17. The method of claim 1, wherein the second dielectric layer is a material with a high dielectric constant.

18. The method of claim 1, wherein the second dielectric layer is one of $SiO_2$, $Si_xN_y$, SiON, $Si_xC_y$, $Si_xO_yN_z$, $Si_xO_yC_z$, $Al_xO_y$, $Hf_xO_y$, and $Ta_xO_y$.

19. The method of claim 1, wherein the second dielectric layer is comprised of multiple layers of dielectric material.

20. The method of claim 1, wherein the first conductive layer, the second conductive layer, and the third conductive layer are one of Ti, TiN, TiW, Ta, TaN, W, WN, Pt, Ir, Ru, Rh, Os, Pd, and Al.

* * * * *